United States Patent
Hong et al.

(10) Patent No.: US 9,178,094 B1
(45) Date of Patent: Nov. 3, 2015

(54) METHOD FOR PACKAGING SOLAR CELL RECEIVER HAVING SECONDARY OPTICAL ELEMENTS

(71) Applicant: ATOMIC ENERGY COUNCIL-INSTITUTE OF NUCLEAR ENERGY RESEARCH, Taoyuan County (TW)

(72) Inventors: Hwen-Fen Hong, Taoyuan County (TW); Zun-Hao Shih, Taoyuan County (TW); Yueh-Mu Lee, Taoyuan County (TW); Yi-Ping Liang, Taoyuan County (TW); Hwa-Yuh Shin, Taoyuan County (TW)

(73) Assignee: Atomic Energy Council—Institute of Nuclear Energy Research, Taoyuan County (TW)

( * ) Notice: Subject to any disclaimer, the term of this patent is extended or adjusted under 35 U.S.C. 154(b) by 0 days.

(21) Appl. No.: 14/464,787

(22) Filed: Aug. 21, 2014

(51) Int. Cl.
*H01L 31/048* (2014.01)
*H01L 31/18* (2006.01)
*H01L 31/0232* (2014.01)
*H01L 31/0236* (2006.01)
*H01L 31/0216* (2014.01)

(52) U.S. Cl.
CPC ........ *H01L 31/048* (2013.01); *H01L 31/02168* (2013.01); *H01L 31/02327* (2013.01); *H01L 31/02366* (2013.01); *H01L 31/18* (2013.01)

(58) Field of Classification Search
CPC ............... H01L 31/02366; H01L 31/0203; H01L 31/02167; H01L 31/02168; H01L 21/56; H01L 23/3107
See application file for complete search history.

(56) References Cited

U.S. PATENT DOCUMENTS

| | | | | |
|---|---|---|---|---|
| 2012/0024347 A1* | 2/2012 | Lin et al. | | 136/251 |
| 2014/0182657 A1* | 7/2014 | Goto et al. | | 136/246 |
| 2014/0224299 A1* | 8/2014 | Goto et al. | | 136/246 |
| 2014/0299184 A1* | 10/2014 | Fonash et al. | | 136/256 |
| 2015/0017479 A1* | 1/2015 | Kim et al. | | 428/687 |

* cited by examiner

*Primary Examiner* — Joseph C Nicely
(74) *Attorney, Agent, or Firm* — Rosenberg, Klein & Lee

(57) ABSTRACT

The present invention relates to a method for packaging solar cell receivers having secondary optical elements. The present invention adopts a mold having mold cavities with special shapes. By filling mold cavities with optical encapsulant, the substrate containing solar cells is placed upside down towards the mold. Then the solar cells are immersed into the optical encapsulant before curing. Then, the cured optical encapsulant has the characteristics of the secondary optical elements and thus can be used as secondary optical elements such as spherical lenses. Meanwhile, the packaging of the solar cells is completed as well. The overall process requires only one curing process, which reduces the packaging time substantially.

10 Claims, 5 Drawing Sheets

METHOD FOR PACKAGING SOLAR CELL RECEIVER HAVING SECONDARY OPTICAL ELEMENTS

FIELD OF THE INVENTION

The present invention relates generally to a method for packaging solar cell receiver, and particularly to a method for packaging solar cell with massive secondary optical elements formed thereon in a step by using a mold.

BACKGROUND OF THE INVENTION

The fundamental operation method of solar power generation is to illuminate sunlight on the surface of solar cells. Currently, in order to increase the power generating efficiency, there are concentrated photovoltaic (CPV) modules, which adopt a Fresnel or plano-convex lens (also called first optical element) for concentrating a great deal of photovoltaic energy. Lessening single size of first optical element and solar cell can shorten focus length and thus thin CPV module. Miniaturization of CPV module can decrease both frame material and cost of transportation.

In practice, secondary optical elements, such as spherical lenses, should be used together with small-area solar cells in the CPV modules for increasing sufficient optical alignment tolerance. Nonetheless, the present method for fixing spherical lenses is difficult and complicated. One of current general secondary optical elements is like glass ball lenses or homogenizer with characteristics of high transmittance and hardness. Another type of secondary optical elements is designed to collect the incident light by reflection, which is called metal collector. If metal collectors are adopted for fabricating secondary optical elements, screw fastening is required for installation, which consumes a substantial amount of labor and components such as screws. On the other hand, if glass ball lenses are adopted, while combining the secondary optical elements with the solar cells on the circuit board, the primary optical encapsulant should be applied first for protecting all surfaces of the solar cells and the metal bonding wires.

Please refer to FIGS. 1A to 1C, which show the schematic diagrams of the method for packaging secondary optical element of solar cell receiver according to the prior art. As shown in the figures, solar cells are first disposed on a substrate 50. Then, gold bonding wires are used for connecting electrically the solar cells with the circuit on the substrate 50. The solar cells 51 and the gold bonding wires are packages on the substrate 50 after curing first optical encapsulant 52.

Next, a particular amount of second optical encapsulant 53 is coated on the hardened first optical encapsulant 52. Then the spherical lens 54, which is used as the secondary optical element, is placed on the second optical encapsulant 53. Afterwards, second is cured and the spherical lens 54 is thus fixed virtually on the solar cell 51.

According to the method described above, while installing the glass secondary optical element, the first optical encapsulant packaging is performed beforehand for protecting all surfaces of the solar cells and the gold bonding wires from damages of down-force pressure of the secondary optical elements. After the optical encapsulant coated in the first time was cured, the optical encapsulant of the second time is applied and the secondary optical elements are placed. Then, the curing process for the secondary encapsulant is performed. Consequently, there are more process steps and time. In particular, the unavoidable double period of curing time is detrimental to mass production.

Accordingly, the present invention provides a novel method for packaging, which enables rapid installation of secondary optical elements in a CPV module onto solar cells as well as lowering the manufacturing cost and complexity. Thereby, the present invention will contribute to the development and promotion of CPV modules.

SUMMARY

An objective of the present invention is to provide a method for packaging solar cell receiver having secondary optical elements, which uses a mold having mold cavities of a hemispecial plus cylinder shape. By filling and curing optical encapsulant in the cavities, the cured optical encapsulant can have the characteristics of secondary optical elements as well as acting as spherical lenses. Meanwhile, the fabrication of solar cell receiver is also completed. The overall package procedure requires only one curing step, substantially shortening the required time.

Another objective of the present invention is to provide a method for packaging solar cell receiver having secondary optical elements. According to the present invention, the packaging speed is not influenced by the quantity of solar cells and the area of the substrate, which is thereby beneficial to fabricating the CPV modules having massive solar cell receivers and advantageous in cost reduction.

Still another objective of the present invention is to provide a method for packaging solar cell receiver having secondary optical elements, which adopts optical encapsulant as the material of secondary optical elements. The excellent optical properties of optical encapsulant can substitute glass spherical lenses effectively.

In order to achieve the objectives described above, the present invention discloses a method for packaging solar cell receiver having secondary optical elements, which comprises steps of manufacturing a metal mold, the mold having at least a mold cavity, and the optical encapsulant filling the mold cavity; placing a substrate upside down towards the mold, at least a solar cell mounted on upside of the substrate, the solar cell corresponding to the mold cavity and immersed downwards in the optical encapsulant; curing the optical encapsulant, and sealing the solar cell in the cured optical encapsulant; and removing the mold, and forming the solar cell receiver; where the optical encapsulant forms the secondary optical elements in the mold cavity so that the incident light can be focused by the secondary optical element and illuminate the surface of the solar cell concentratively.

DETAILED DESCRIPTION

In order to make the structure and characteristics as well as the effectiveness of the present invention to be further understood and recognized, the detailed description of the present invention is provided as follows along with embodiments and accompanying figures.

The method for packaging solar cell receiver having secondary optical elements according to the present invention comprises steps of:

Step S1: manufacturing a metal mold, the mold having at least a mold cavity, and the optical encapsulant filling the mold cavity by injection;

Step S2: Placing a substrate upside down towards the mold, at least a solar cell mounted on upside of the substrate, the solar cell corresponding to the mold cavity and immersed downwards in the optical encapsulant;

Step S3: Curing the optical encapsulant, and sealing the solar cell in the hardened optical encapsulant; and Step S4: Removing the mold, and forming the solar cell receiver.

Figure 1A:
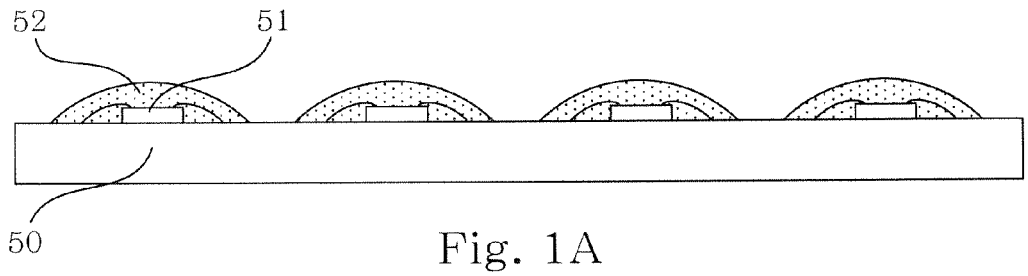
FIGS. 1A to 1C show schematic diagrams of the method for packaging secondary optical element of solar cell receiver according to the prior art.
Figure 1B:
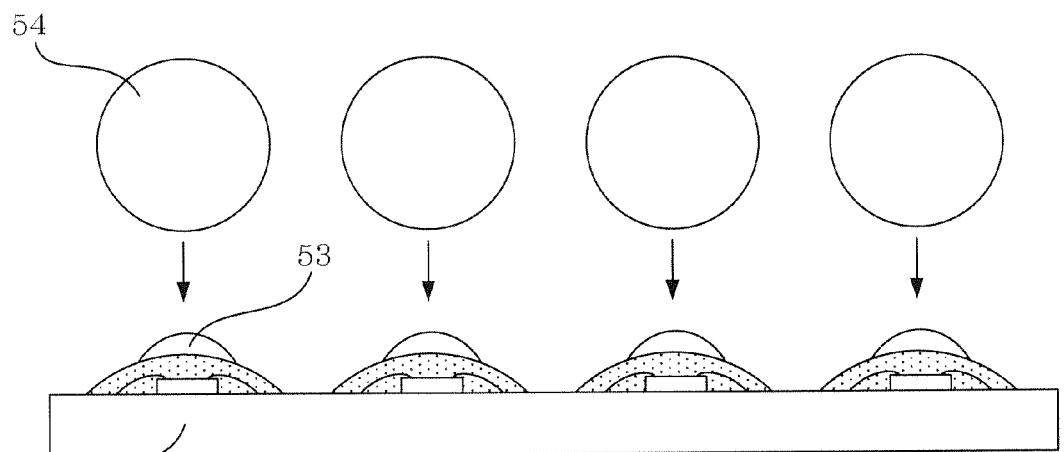
Figure 1C:
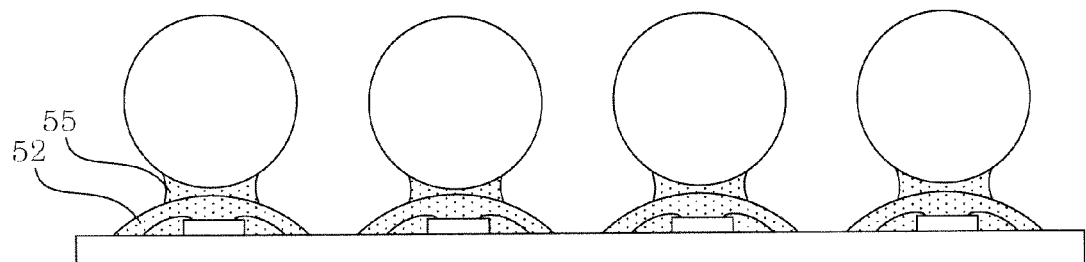
Figure 2:
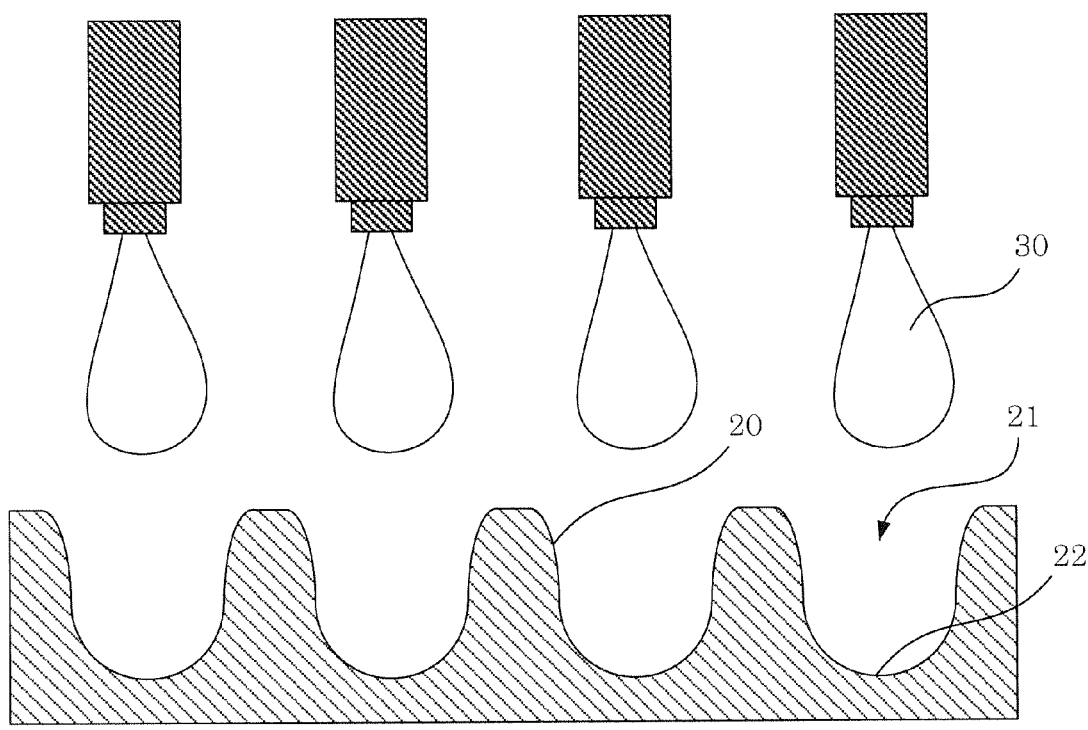
FIG. 2 shows a schematic diagram of the step for optical encapsulant be filling the mold cavities according to a preferred embodiment of the present invention.

According to the steps described above, please refer to FIG. 2 first. According to the present invention, a mold is used as the aid for completing one-step curing procedure. The mold 20 includes the mold cavities 21. The number of the mold cavities 21 depends on the number of solar cells in the solar cell receiver. A preferred design is to arrange the mold cavities 21 of the mold 20 in a matrix form for completing the packaging of matrix-type solar cell receiver.

According to a preferred embodiment of the present invention, the mold 20 has at least a mold cavity 21 and a concave surface 22. The preferred choice of the concave surface 22 is dome-shaped. For forming the second optical elements such as spherical lenses, the outline of the mold cavity 21 is formed in the concave surface 22, which enable the subsequent product to have the function of spherical lenses. That is to say, second optical element can increase sufficient optical alignment tolerance of the solar cell receivers.

Figure 3:
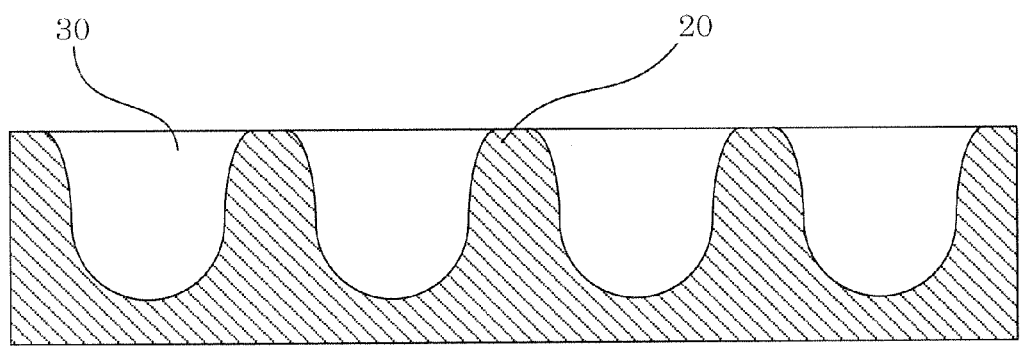
FIG. 3 shows a schematic diagram of the optical encapsulant have filled the mold cavities according to a preferred embodiment of the present invention.
Figure 4:
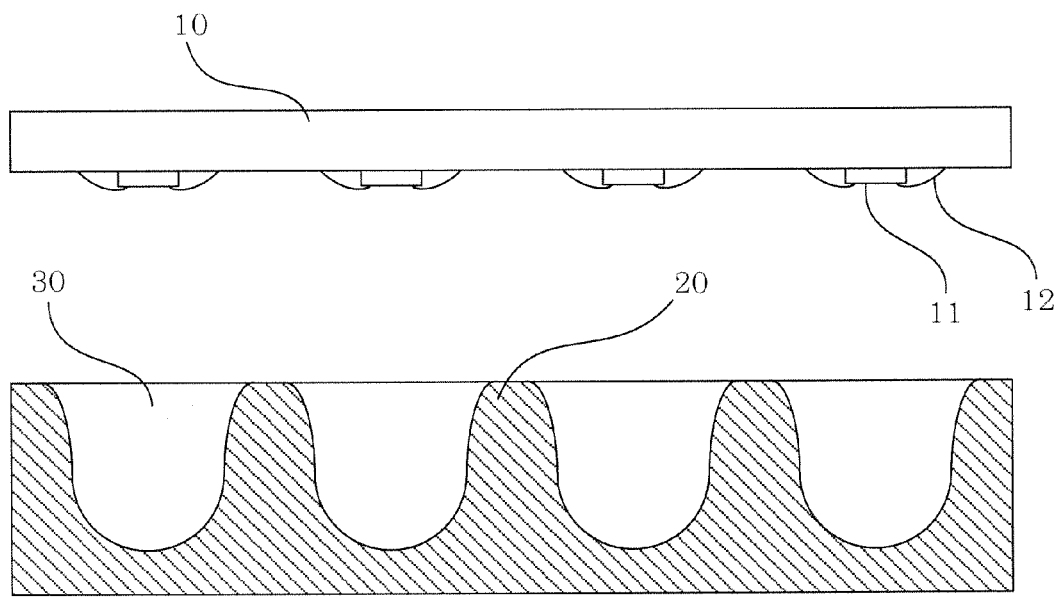
FIG. 4 shows a schematic diagram of the step for placing the substrate having the solar cells on the mold according to a preferred embodiment of the present invention.

According to the present invention, the uncured optical encapsulant 30 fills in the mold cavities 21 as shown in FIG. 3. Then, as shown in FIG. 4, the substrate 10 is placed on the mold 20. At least a solar cell 11 is mounted on upside of the substrate 10. The substrate 10 is upside down toward the mold 20. In addition, the location of the solar cells 11 corresponds to the mold cavities 21 of the mold 20 with each single solar cell 11 corresponding to a single mold cavity 21. Thereby, these solar cells 11 corresponding to the mold cavities 21 are immersed into the uncured optical encapsulant 30.

The substrate 10 described above is a circuit board. The solar cells 11 and its printed circuit are deposited on the upside of the substrate 10. In addition to soldering the solar cells 11 on the substrate 10, the gold bonding wires 12 are also bonded on the substrate 10. These gold bonding wires 12 connect the solar cells 11 to the substrate 10 for conducting current.

Figure 5:
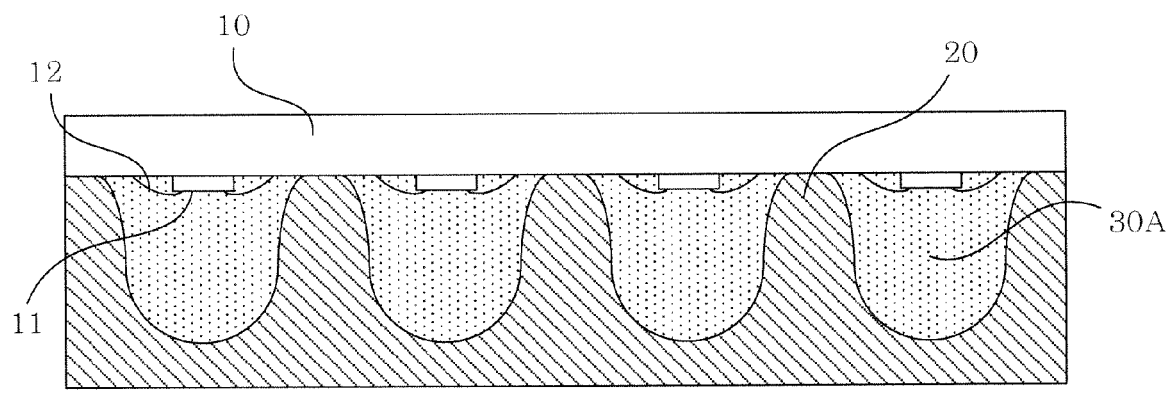
FIG. 5 shows a schematic diagram of the step for curing optical encapsulant within the mold cavities according to a preferred embodiment of the present invention.

After immersing the solar cells 11 in the uncured optical encapsulant 30, curing the optical encapsulant 30 through heating the mold 20 with a particular temperature, so that the solar cells 11 and the gold bonding wires 12 can be sealed in the cured optical encapsulant 30A, as shown in FIG. 5.

In this step, the temperature for curing optical encapsulant 30 depends on the property of the optical encapsulant adopted. The heating time is approximately 80 to 100 minutes here. Preferably, the heating time is 90 minutes. This stage occupies the main process time in the method for packaging according to the present invention. Compared with the two curing steps according to the prior art, the process time of the present invention has been reduced significantly. Thereby, the requirements for mass production by the industry will be satisfied if the process time is shortened effectively.

Figure 6:
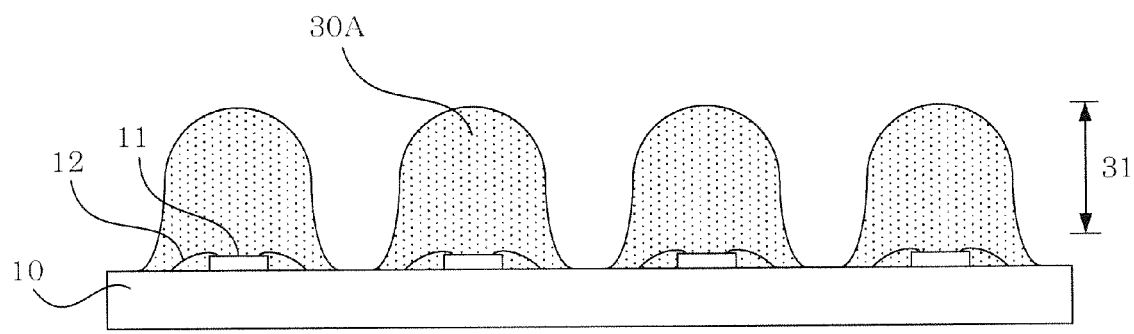
FIG. 6 shows a schematic diagram of the appearance of the solar cell receivers after the mold is removed according to a preferred embodiment of the present invention.

After the optical encapsulant 30 is cured and the cured optical encapsulant 30A is thus formed, the mold 20 can be removed, leaving the finished product of the solar cell receivers as shown in FIG. 6. All solar cells 11 and gold bonding wires 12 are packaged in the hardened optical encapsulant 30A. The shape of the cured optical encapsulant 30A is depended on the shape of the mold cavity 21 of the mold 20 shown in FIG. 2. By applying the characteristics of spherical lens of secondary optical element 31, the incident sunlight can be focused by the secondary optical elements 31 and turn a luminous spot on the surface of solar cell 11. Namely, by decreasing the single area of Fresnel lenses and adopting the secondary optical elements, it can shorten the focus length of the incident light and thus increasing sufficient optical alignment tolerance. At the same time, CPV module will become thinner to having financial advantage for mass production.

Figure 7:
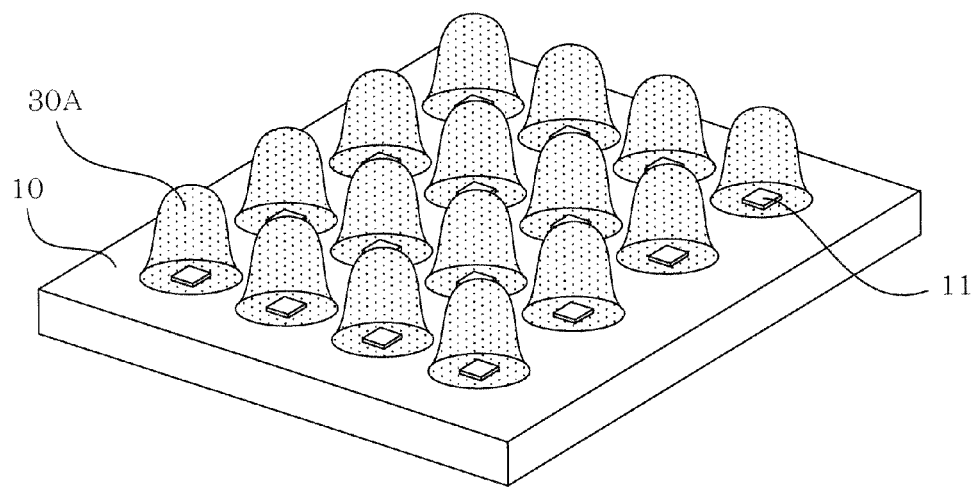
FIG. 7 shows a schematic diagram of the fabricated solar cell receivers arranged in a matrix according to a preferred embodiment of the present invention.

FIG. 7 shows one of the advantages in mass production according to a preferred embodiment of the present invention. As described above, according to a preferred design of the present invention, the mold cavities 21 of the mold 20 are arranged in a matrix form for packaging the matrix-type solar cell receivers in a step. Thereby, massive solar cells 11 are included on a single substrate 10 with the cured optical encapsulant 30A acting as the secondary optical elements. Moreover, the technology according to the present invention can also be applied to large-area solar cell receiver packaging. As long as the size of the mold is adjusted to be comparable to the size of the substrate, the steps and time in the packaging process of the second optical elements will not increase as the substrate area or the quantity of solar cells increases.

Figure 8:
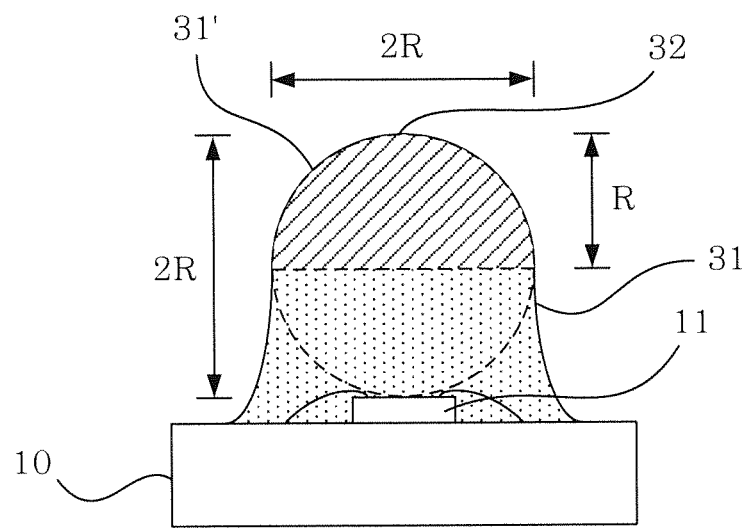
FIG. 8 shows a structural schematic diagram of the size and ratio of the secondary optical element structure according to a preferred embodiment of the present invention.
Figure 9:
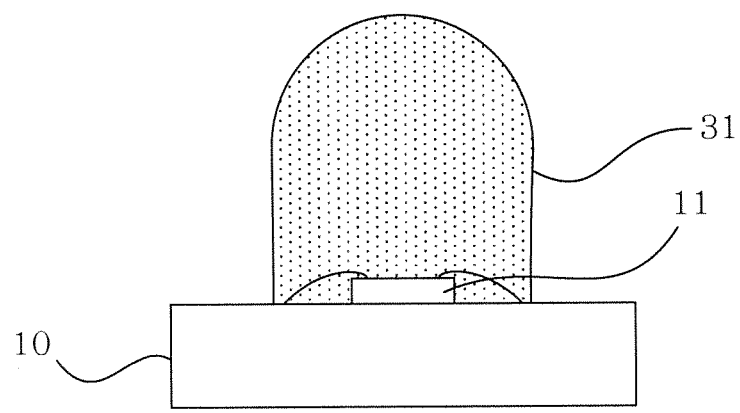
FIG. 9 shows a structural schematic diagram of the bullet-shaped secondary optical element according to a preferred embodiment of the present invention.

FIG. 8 discloses the relative position of the secondary optical element and the solar cell 11. As shown in the figure, the optical encapsulant is cured to form the secondary optical element 31. The upper half (sloped-line area) of the secondary optical element 31 is a hemisphere 31' with a radius of R. This kind of hemispherical shape can save time and reduce difficulty in fabricating molds. In addition, it can serve as a secondary concentrating lens, which concentrates light on the solar cell 11. The center of the bottom plane of the hemisphere 31' is located right above the active-area center of the solar cell 11. Besides, the distance between the bottom plane of the hemisphere 31' and the surface of the solar cell 11 is equal to the radius R of the hemisphere 31'. That is to say, the distance between the top apex 32 of the secondary optical element 31 and the surface of the solar cell is 2R. It can be considered that the secondary optical element 31 actually contains a sphere with a diameter of 2R. The shape of the peripheral region below the hemisphere 31' of the secondary optical element 31 is not limited. The most fundamental shape of the secondary optical element formed by hardening optical encapsulant is bullet-shaped. As shown in FIG. 9, the bottom half of the bullet shape can be adjusted to various patterns depended on the requirements of the further packages or applications.

To sum up, the present invention discloses in detail a method for packaging solar cell receiver having secondary optical element. According to the prior art, it suffers difficulty and longer fabricating time in mass production. In particular, in order to protect all surfaces of the solar cells and the gold bonding wires from damages of down-force pressure of the secondary optical elements, two optical encapsulant curing stages are adopted in the past manufacturing method, which to lead to more procedures and longer manufacturing time. According to the present invention, optical encapsulant is injected into specific mold cavities of a mold. After solar cells are immersed into the optical encapsulant, the latter is cured. Finally, the mold is removed and thus the fabrication of secondary optical elements can be completed just in one curing step. In addition, the difficulty of the method for packaging procedure according to the present invention will not be increased as it is applied to large-area solar cell receiver. This process has benefits to the mass-production requirements of the industry. Given the advantages of low cost and packaging simplification, in short, the present invention indeed provides a method for packaging solar cell receiver having secondary optical elements with economic and practical values.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. A method for packaging solar cell receiver having secondary optical elements, comprising steps of:
   injecting optical encapsulant into a mold, said mold having at least a mold cavity, said mold cavity recessed on the inner surface of said mold, and said optical encapsulant filling said mold cavity;
   placing a substrate upside down towards said mold, at least a solar cell mounted on upside of said substrate, said solar cell corresponding to said mold cavity and immersed downwards in said optical encapsulant;
   curing said optical encapsulant, and sealing said solar cell in said cured optical encapsulant; and
   removing said mold, and forming said solar cell receiver;
   wherein said optical encapsulant forms said secondary optical elements in said mold cavity so that the incident light can be focused by said secondary optical element and increasing optical alignment tolerance.

2. The method for packaging solar cell receiver having secondary optical elements of claim 1, wherein said step of curing said optical encapsulant is through heating said mold.

3. The method for packaging solar cell receiver having secondary optical elements of claim 2, wherein the heating time is 80 to 100 minutes.

4. The method for packaging solar cell receiver having secondary optical elements of claim 1, wherein said solar cells are mounted on said upside of said substrate by soldering.

5. The method for packaging solar cell receiver having secondary optical elements of claim 1, wherein each single solar cell corresponds to a single mold cavity.

6. The method for packaging solar cell receiver having secondary optical elements of claim 1, wherein a plurality of gold bonding wires are further bonded on said upside of said substrate and connected with said solar cells.

7. The method for packaging solar cell receiver having secondary optical elements of claim 6, wherein said plurality of gold bonding wires are sealed in said cured optical encapsulant.

8. The method for packaging solar cell receiver having secondary optical elements of claim 6, wherein said substrate is a circuit board, and said plurality of gold bonding wires are further bonded on said circuit board to connect said solar cell and said circuit board.

9. The method for packaging solar cell receiver having secondary optical elements of claim wherein said secondary optical elements have the characteristics of spherical lenses.

10. The method for packaging solar cell receiver having secondary optical elements of claim 9, wherein each of said secondary optical elements comprises a hemisphere with a height of a half of the distance between the top apex of said secondary optical element and the surface of said solar cell.

* * * * *